(12) United States Patent
Vijay et al.

(10) Patent No.: US 11,824,474 B2
(45) Date of Patent: Nov. 21, 2023

(54) MOTOR DRIVE ELECTRONICS USING THERMOELECTRIC MATERIAL

(71) Applicant: HAMILTON SUNDSTRAND CORPORATION, Charlotte, NC (US)

(72) Inventors: Ashish Vijay, Rajasthan (IN); Anil Prasad Josyula, Andhra Pradesh (IN); Harish Venkatesha, Karnataka (IN); Somasekhar Valleru, Bangalore (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 248 days.

(21) Appl. No.: 17/151,710

(22) Filed: Jan. 19, 2021

(65) Prior Publication Data
US 2022/0166368 A1 May 26, 2022

(30) Foreign Application Priority Data
Nov. 23, 2020 (IN) .............................. 202011050909

(51) Int. Cl.
| | |
|---|---|
| *H02P 29/68* | (2016.01) |
| *H02P 29/032* | (2016.01) |
| *G05D 23/20* | (2006.01) |
| *B64D 27/24* | (2006.01) |
| *B64D 31/00* | (2006.01) |

(Continued)

(52) U.S. Cl.
CPC .............. *H02P 29/68* (2016.02); *B64D 27/24* (2013.01); *B64D 31/00* (2013.01); *B64D 41/00* (2013.01); *B64D 43/00* (2013.01); *G05D 23/20* (2013.01); *H02P 29/032* (2016.02)

(58) Field of Classification Search
CPC ....... H02P 29/68; H02P 29/032; B64D 27/24; B64D 31/00; B64D 41/00; B64D 43/00; H01L 35/30; F25B 21/02; G05D 23/20
See application file for complete search history.

(56) References Cited

U.S. PATENT DOCUMENTS

| | | |
|---|---|---|
| 6,088,662 A | 7/2000 | Flinsbaugh et al. |
| 10,036,579 B2 | 7/2018 | Ludwig |

(Continued)

FOREIGN PATENT DOCUMENTS

| | | | | |
|---|---|---|---|---|
| EP | 3839528 A1 * | 6/2021 | ........... | G01K 15/005 |
| EP | 2737572 B1 * | 8/2022 | ................ | B60L 1/00 |

(Continued)

OTHER PUBLICATIONS

Extended European Search Report for EP Application No. 21207592.3, dated Apr. 4, 2022, pp. 1-7.

*Primary Examiner* — Bickey Dhakal
(74) *Attorney, Agent, or Firm* — CANTOR COLBURN LLP

(57) ABSTRACT

System and methods for motor drive electronics are provided. Aspects include receiving, by a controller on a motor driver electronics (MDE) component, voltage data associated with a thermoelectric generator, wherein the MDE component is configured to operate an electric motor, and wherein the MDE component comprises a power card including one or more components, determining a temperature reading based on the voltage data, enacting an action associated with the MDE component based at least in part on the temperature reading.

20 Claims, 5 Drawing Sheets

(51) Int. Cl.
*B64D 41/00* (2006.01)
*B64D 43/00* (2006.01)

(56) References Cited

U.S. PATENT DOCUMENTS

| | | | | |
|---|---|---|---|---|
| 2003/0184941 | A1* | 10/2003 | Maeda | G06F 1/203 |
| | | | | 361/103 |
| 2004/0135550 | A1* | 7/2004 | Nishihata | H01M 10/615 |
| | | | | 320/150 |
| 2005/0235652 | A1* | 10/2005 | Iwasaki | F25B 21/02 |
| | | | | 62/3.7 |
| 2017/0025815 | A1 | 9/2017 | Fontana et al. | |
| 2017/0299237 | A1* | 10/2017 | Huang | F25B 21/02 |

FOREIGN PATENT DOCUMENTS

| | | | | |
|---|---|---|---|---|
| JP | 11154720 | A | * | 6/1999 |
| JP | 11154720 | A | | 6/1999 |
| JP | 2000340723 | A | | 12/2000 |
| JP | 200456054 | A | | 2/2004 |
| JP | 2011223696 | A | * | 11/2011 |
| JP | 2017037113 | A | | 2/2017 |

* cited by examiner

MOTOR DRIVE ELECTRONICS USING THERMOELECTRIC MATERIAL

CROSS-REFERENCE TO RELATED APPLICATIONS

This application claims the benefit of Indian Patent Application No. 202011050909 filed Nov. 23, 2020, which is incorporated herein by reference in its entirety.

BACKGROUND

The present invention generally relates to motor drive systems, and more specifically, to temperature monitoring and energy harvesting in motor drive electronics (MDE) using thermoelectric material.

Temperature sensors and heat sinks find application in a wide range of technical fields. For example, they can be used to monitor and regulate temperature on motor drive electronics. These MDEs are in recent times finding greater application in the aircraft industry where there is a trend away from hydraulic systems and pneumatic systems to so-called more electric aircraft (MEA) using electrical subsystems, such as electric actuators, and controls.

Particularly in aircraft application, but also in other applications where temperature sensors and heat sinks are used, weight, size, cost, and reliability are all important factors. MDEs generate a great amount of heat during operation within an aircraft. Accordingly, there is a need to provide systems and methods for dissipating heat within an MDE that reduces cost, weight, and size of the MDE.

BRIEF DESCRIPTION

Embodiments of the present invention are directed to an electric motor system. A non-limiting example of the system includes an electric motor, a motor driver electronics (MDE) component configured to operate the electric motor, the MDE component comprising a power card comprising one or more components, a heatsink comprising a thermoelectric generator, and a controller configured to receive voltage data associated with the thermoelectric generator, determine a temperature reading based on the voltage data, and enact an action associated with the MDE component based at least in part on the temperature reading.

Embodiments of the present invention are directed to a method. A non-limiting example of the method includes receiving, by a controller on a motor driver electronics (MDE) component, voltage data associated with a thermoelectric generator, wherein the MDE component is configured to operate an electric motor, and wherein the MDE component comprises a power card including one or more components, determining a temperature reading based on the voltage data, enacting an action associated with the MDE component based at least in part on the temperature reading.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
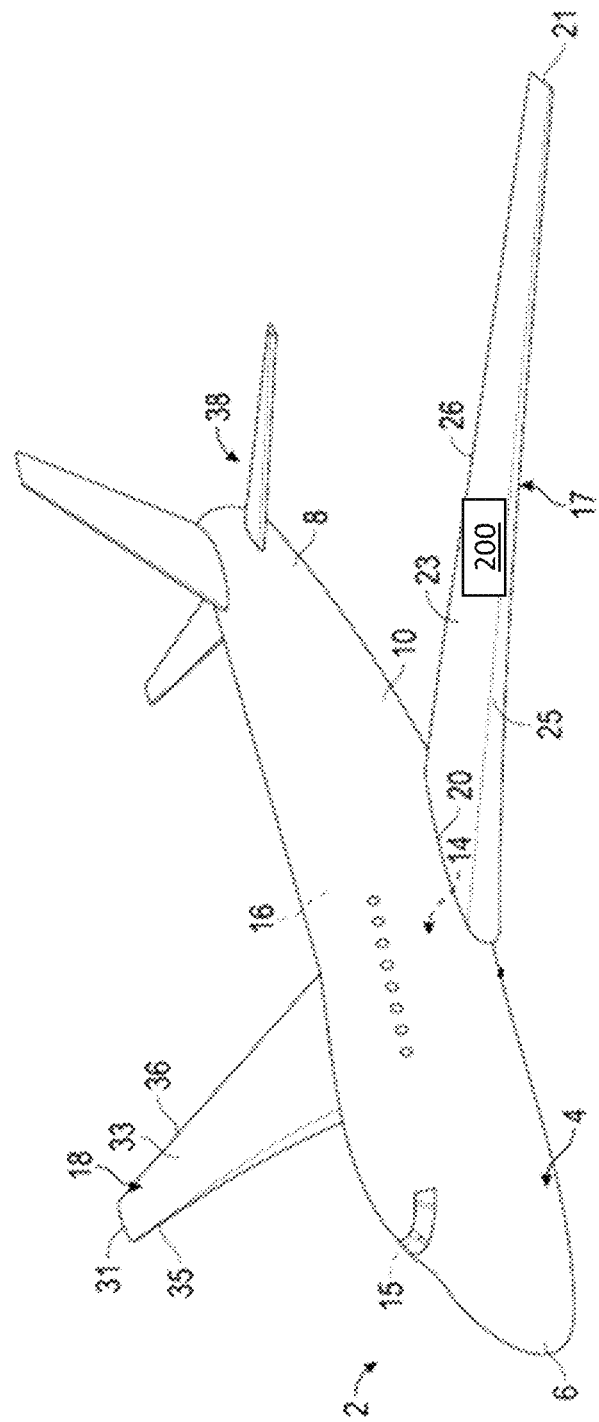
FIG. 1 is a perspective view of an aircraft that may incorporate embodiments of the present disclosure.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Referring now to the figures, a perspective view of an aircraft 2 that may incorporate embodiments of the present disclosure. Aircraft 2 includes a fuselage 4 extending from a nose portion 6 to a tail portion 8 through a body portion 10. Body portion 10 houses an aircraft cabin 14 that includes a crew compartment 15 and a passenger or cargo compartment 16. Body portion 10 supports a first wing 17 and a second wing 18. First wing 17 extends from a first root portion 20 to a first tip portion 21 through a first airfoil portion 23. First airfoil portion 23 includes a leading edge 25 and a trailing edge 26. Second wing 18 extends from a second root portion (not shown) to a second tip portion 31 through a second airfoil portion 33. Second airfoil portion 33 includes a leading edge 35 and a trailing edge 36. Tail portion 8 includes a stabilizer 38. Aircraft 2 includes an engine configured to provide propulsion to the aircraft 2. The aircraft 2 also includes an electric motor system 200 (described in greater detail in FIG. 2).

Turning now to an overview of technologies that are more specifically relevant to aspects of the disclosure, the concept of a fully electric aircraft (FEA) has been proposed in the past. However, to achieve a FEA, the technological space must first contend with a more electric aircraft (MEA). In the MEA, functionality that has previously been achieved utilizing a pneumatic and/or hydraulic system can now be replaced fully or partially by an electric system. A few examples where the previous systems can be substituted for an electric system include, but are not limited to, flight controls, fuel pumps, oil pumps, cooling pumps, landing system, cargo and air management systems, and the like.

Figure 2:
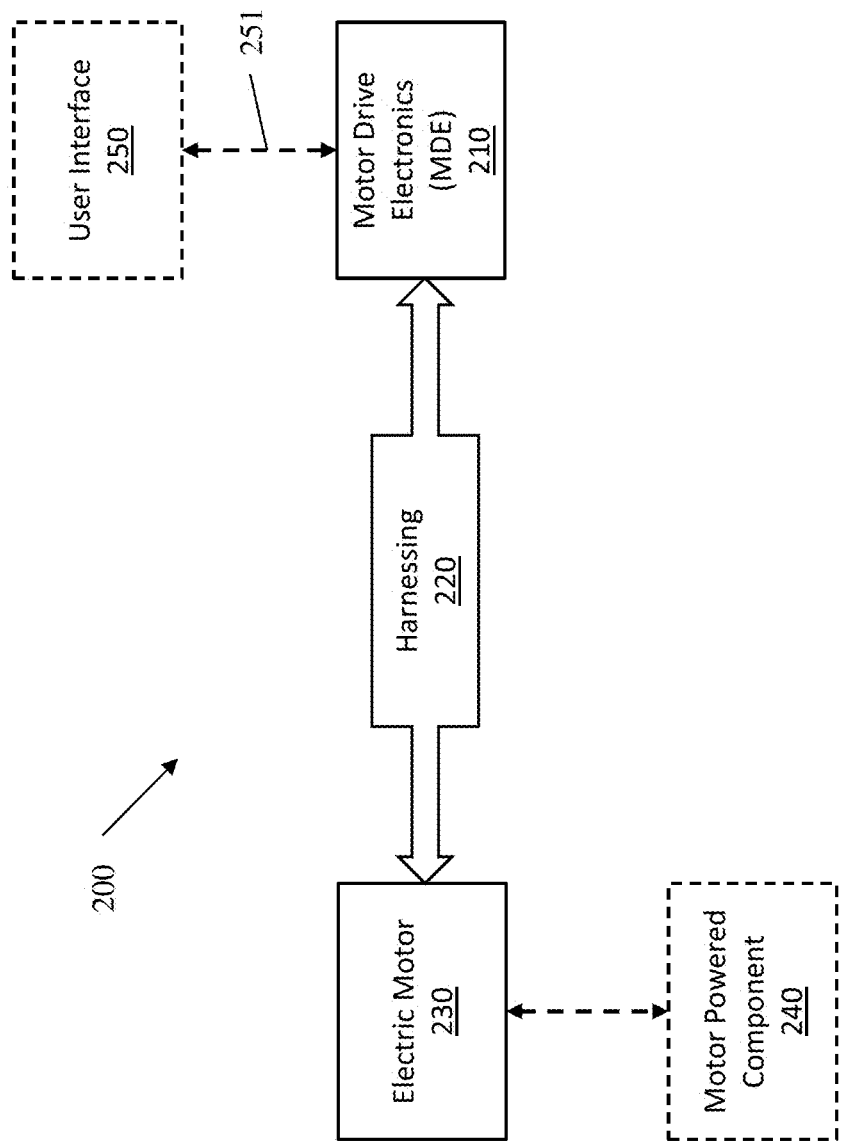
FIG. 2 depicts a block diagram of an electric motor system 200 in accordance with one or more embodiments of the present disclosure.

Electric systems typically include control circuitry, a power supply, and an electric motor along with other components such as feedback and monitoring sensors and mechanical connections. FIG. 2 depicts a block diagram of an electric motor system 200 in accordance with one or more embodiments of the present disclosure. The electric motor system 200 includes a motor drive electronics (MDE) component 210 and an electric motor 230. The MDE component 210 is communicatively and electrically connected to the electric motor 230 using a harnessing 220 which includes one or more wires. The electric motor 230 can be any electric motor type and size dependent on the specific motor powered component 240 that the electric motor 230 is powering. For example, motor powered component 240 can be a pump, compressor, actuator, and/or starter. Further, the motor powered component 240 can include a plurality of elements that the electric motor 230 is powering. For example, an aircraft's electric brake (eBrake) that includes eight actuators can be driven by the single MDE component 210 and electric motor 230.

Further, in one or more embodiments, the electric motor system 100 can also include a user interface 250 that is connected to the MDE component 210. The user interface 250 can receive and transmit signals 251 to and from the MDE component 210. For example, the user interface 250 can collect and transmit user input signals for controlling the electric motor 230. Further, the user interface 250 can receive information from the MDE component 210 about temperature readings, voltage and current measurements, and the like.

In one or more embodiments, the MDE component 210 can include a power card having a variety of circuits including, but not limited to, AC/DC converters, AC/DC reactors, on-board power supplies, inverter and gate drivers, and a braking resistor circuit. Additionally, the MDE component 210 includes a controller that can be implemented utilizing a field programmable gate array (FPGA) and the like.

In one or more embodiments, the power card provides functionality such as power conversion, regenerative braking, and the like and uses switching devices and resistors to achieve this functionality. These components tend to generate a significant amount of heat due to losses. Thus, thermal management of the MDE component 210 can be achieved utilizing heat sinks. A heat sink is, typically, a passive heat exchanger that transfers the heat generated by an electronic or a mechanical device to a fluid medium, often air or a liquid coolant, where it is dissipated away from the device, thereby allowing regulation of the device's temperature. The heat sink is a major contributor for overall weight and size of the MDE component 210. Additional contributions to the overall weight and size of the MDE component 210 include temperature sensors which monitor the temperature of the MDE component 210 to allow for an action to be taken when the temperature exceeds a certain value.

Figure 3:
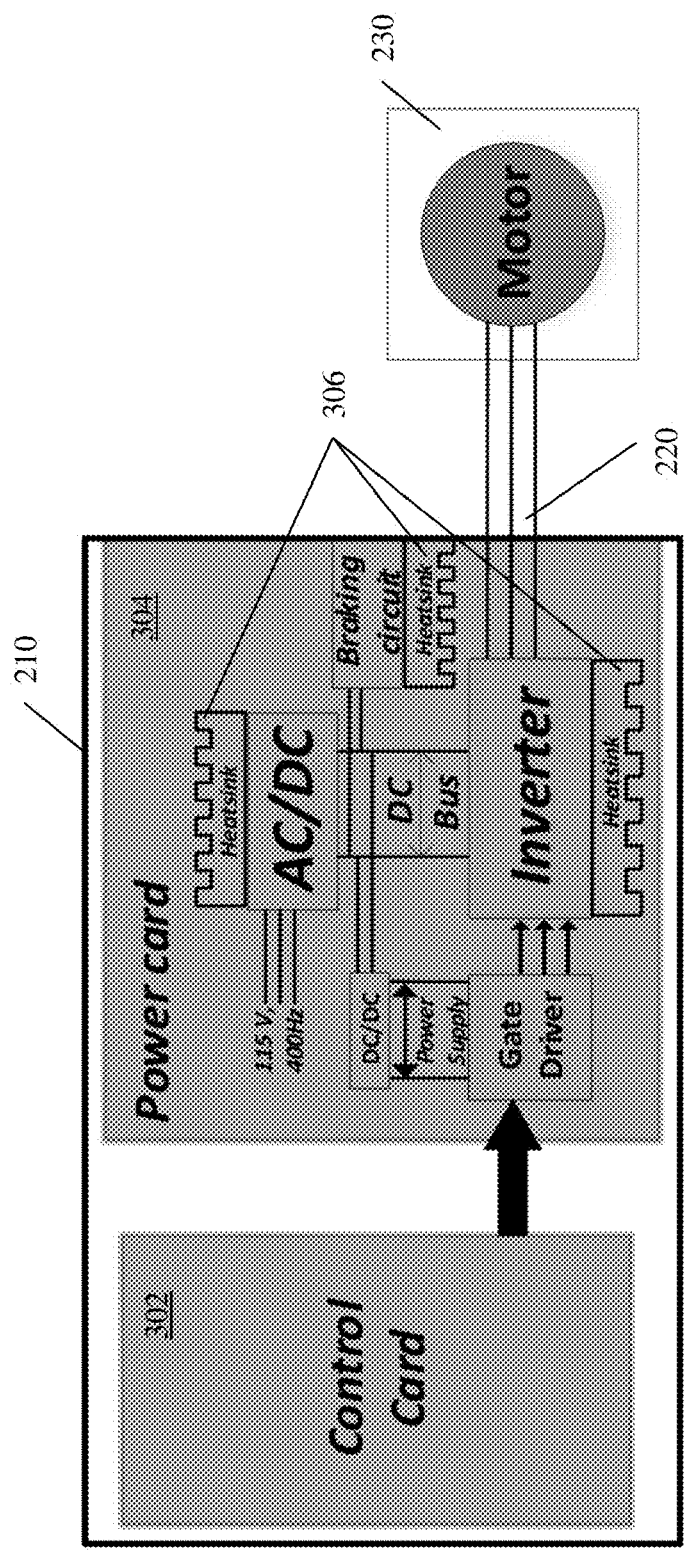
FIG. 3 depicts a block diagram of an MDE with heatsinks according to one or more embodiments.
Figure 4:
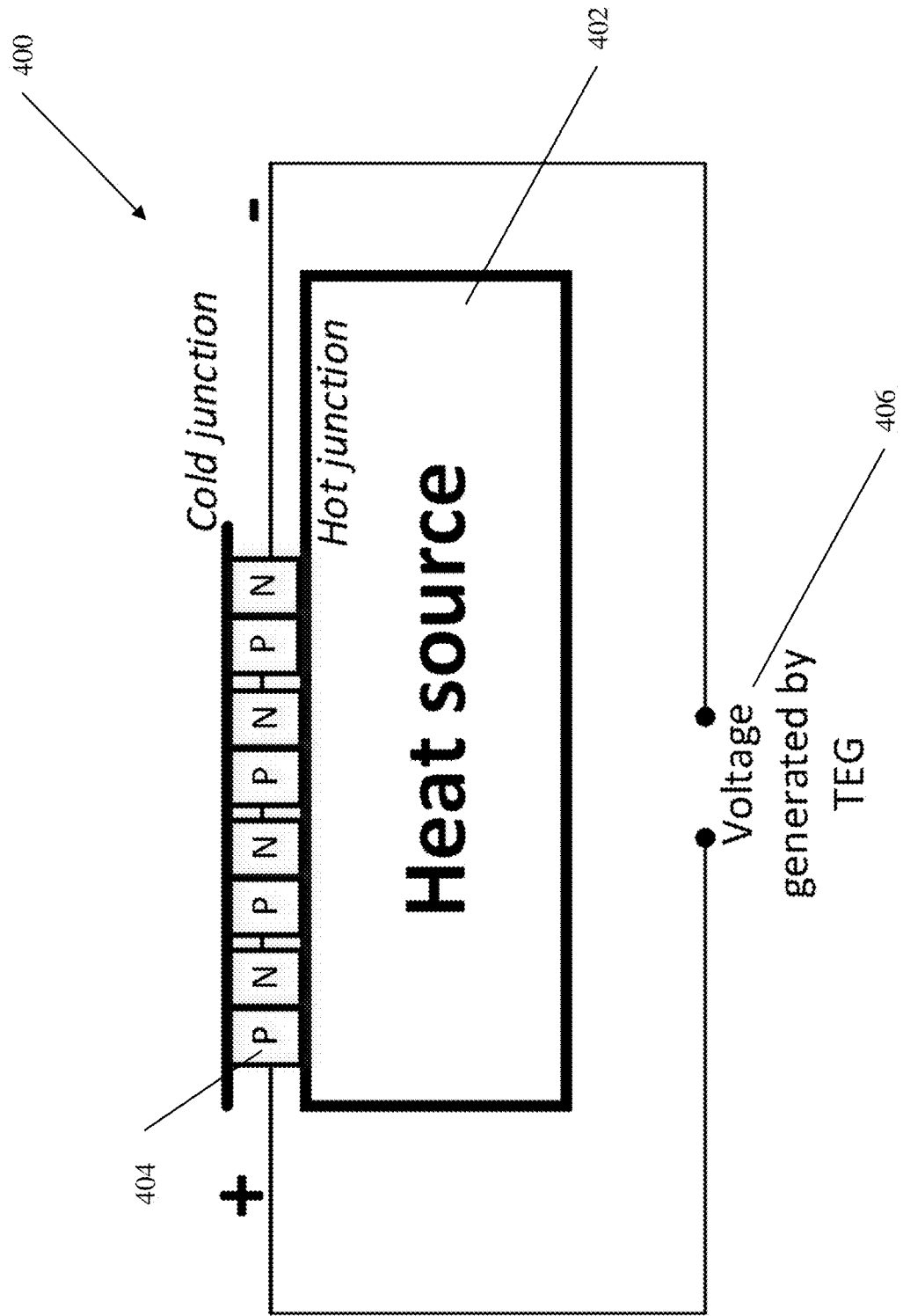
FIG. 4 depicts a diagram of a thermoelectric generator according to one or more embodiments.

In one or more embodiments, aspects of the present disclosure provide for using a thermoelectric generator (TEG) has a heatsink for an MDE. FIG. 3 depicts a block diagram of an MDE with heatsinks according to one or more embodiments. The MDE 210 controls the electric motor 230 through a wiring harness 220. The MDE 210 includes a control card 302 and power card 304. The power card 304 includes a variety of components that require the utilization of heatsinks 306 to assist with dissipation of the generated heat by the components of the MDE 210. In one or more embodiments, the heatsinks 306 can be implemented utilizing TEGs which allows for the dissipation of heat as well as the monitoring of the heat in the MDE 210 without the need for temperature sensors. An MDE 210, typically, generates a great amount of heat during operation of the electric motor 230. Thermoelectric materials have the capability of energy conversion between heat and electricity and vice-a-versa. The thermoelectric materials work through the principle of the Seebeck effect. FIG. 4 depicts a diagram of a thermoelectric generator according to one or more embodiments. The TEG 400 is a solid state device that converts heat flux (temperature differences) directly into electrical energy through the Seebeck effect. The TEG 400 includes materials of different Seebeck coefficients (e.g., the p-doped and n-doped semiconductors). These p-doped and n-doped semiconductors are sometimes referred to as Peltier cells 404. When the TEG 400 experiences a temperature gradient across the two junctions (cold junction and hot junction), the TEG 400 generates a potential difference corresponding to the temperature gradient. As this process continues, the temperature at the hot junction decreases and the cold junction increases (Peltier effect). Terminal voltage and output power are a function of the temperature difference across the junctions. The Peltier cells 404 can be connected in series or parallel configurations to make the TEG 400 match the required voltage and current output or the heat transfer across the junctions. The TEG 400 has the advantage of cooling the heat source 402 and generating a voltage 406. The heat source 402 can include any of the components in the power card 304 for the MDE component 210 from FIG. 3.

Turning back to FIG. 3, the MDE component 210 generates a great amount of heat during operation of the electric motor 230. In one or more embodiments, the heat energy generated during the operation of the MDE component 210 can be converted to electrical energy by utilizing a TEG as the heatsinks 306 in the MDE component 210. In addition to the energy generated, the TEG also cools the components of the MDE 210 through thermoelectric cooling (Peltier effect). The electrical energy generated by the TEG can be utilized for multiple applications including, but not limited to, powering up on board sensors, feeding back to a DC bus, and the like. Hence, the TEG heatsink has the advantage of better thermal management of the MDE 210 and also scavenges heat energy to be used as electrical energy for other applications.

In one or more embodiments, the TEG based heatsink can be utilized to also monitor the temperature of the MDE 210. Heatsink temperature is a factor that determines the on-field operational duty cycle of the MDE. Also, this temperature is required for monitoring purposes. In a typical MDE, the heat sink temperature is sensed using a temperature sensor. Temperature sensors require associated circuitry that includes additional cost and weight. By using a TEG based heatsink, the heatsink temperature can be determined by the control card 302 (sometimes referred to as a controller) from the voltage information by using the characteristic relation between temperature and terminal potential of the TEG. This can eliminate the need for a temperature sensor and associated circuitry to save on cost and weight of the MDE. The temperature information derived from the TEG based heatsink can be utilized for monitoring, prognostics and health management, and the like for the MDE. The control card 302 can receive voltage data associated with the TEG and then determine a temperature reading from the voltage data. Based on the temperature reading, the control card 302 can then enact an action for the MDE 210, the electric motor 240, or the electric system 200. In some embodiments, the temperature readings can be sent to the user interface 250 which can be a display device within an aircraft or other vehicle or system. The user interface 250 can receive an input from a user (e.g., aircraft operator) to enact an action for the MDE 210. For example, the control card 302 on the MDE 210 may enact the action responsive to a temperature reading exceeding a certain threshold or responsive to a user input to the user interface 250. These actions include shutting off the electric motor 230, reducing an output of the electric motor 230, or generating an alert to the user interface 250 or to a monitoring system. In one or more embodiments, the MDE 210 can communicate temperature data to the user interface 250 or to a monitoring system. In other embodiments, the MDE can compare the temperature to a threshold value and enact the action of shutting down the motor 240 or reducing power and/or slowing the motor 240.

In one or more embodiments, some applications for the MDE can require the utilization of both primary and independent monitoring of critical parameters such as temperature. In this scenario, the TEG based heatsink can be utilized as either the primary or the independent temperature sensor along with a separate temperature sensor as the independent or primary sensor.

In one or more embodiments, the control card 302 or any of the hardware referenced in the system 200 or MDE 210 can be implemented by executable instructions and/or circuitry such as a processing circuit and memory. The processing circuit can be embodied in any type of central processing unit (CPU), including a microprocessor, a digital signal processor (DSP), a microcontroller, an application specific integrated circuit (ASIC), a field programmable gate array (FPGA), or the like. Also, in embodiments, the memory may include random access memory (RAM), read only memory (ROM), or other electronic, optical, magnetic, or any other computer readable medium onto which is stored data and algorithms as executable instructions in a non-transitory form.

Figure 5:
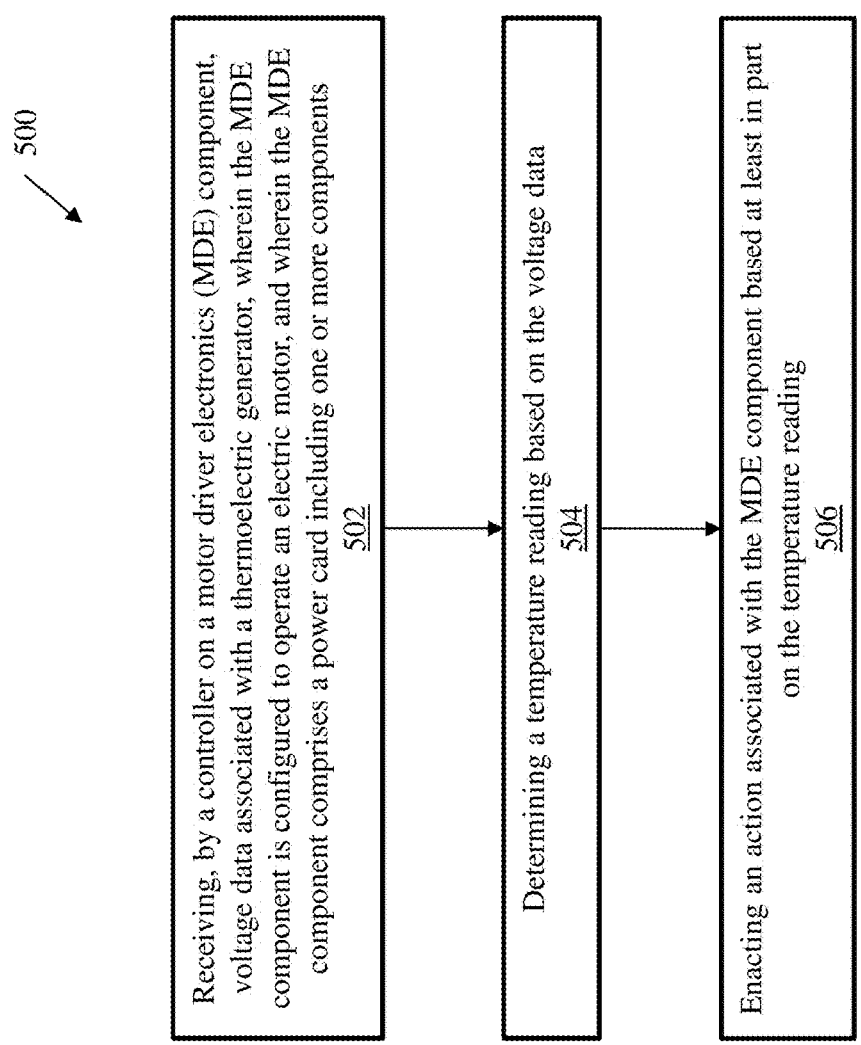
FIG. 5 depicts a flow diagram of a method for thermal management of motor drive electronics according to one or more embodiments.

FIG. 5 depicts a flow diagram of a method for thermal management of motor drive electronics according to one or more embodiments. The method 500 includes receiving, by a controller on a motor driver electronics (MDE) component, voltage data associated with a thermoelectric generator, wherein the MDE component is configured to operate an electric motor, and wherein the MDE component comprises a power card including one or more components, as shown in block 502. The MDE component drives an electric motor with the controller controlling operation of the MDE component. The voltage data can be taken from the thermoelectric generator acting as a heatsink near the one or more electric components that generate heat. This voltage can also be applied to other electronics and/or power sources to allow for recapturing of the voltage from the heat generated from the components on the MDE. The method 500, at block 504, includes determining a temperature reading based on the voltage data. This temperature can be calculated using the known characteristics of the thermoelectric generator and the voltage data taken from the thermoelectric generator. Once the temperature is determined, the method 500, at block 506, includes enacting an action associated with the MDE component based at least in part on the temperature reading. A variety of actions can be taken for the MDE component that includes the reduction or shutting off of the electric motor being operated by the MDE component to allow for cooling to occur.

Additional processes may also be included. It should be understood that the processes depicted in FIG. 5 represent illustrations, and that other processes may be added or existing processes may be removed, modified, or rearranged without departing from the scope and spirit of the present disclosure.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electric motor system comprising:
an electric motor;
a motor driver electronics (MDE) component configured to operate the electric motor, the MDE component comprising:
a power card comprising one or more components configured to drive the electronic motor;
a heatsink comprising a thermoelectric generator, the thermoelectric generator configured to generate voltage data in response to realizing a temperature difference; and
a controller configured to:
control the one or more components of the power card;
receive the voltage data associated with the thermoelectric generator;
determine a temperature reading based on the voltage data; and
enact an action associated with the MDE component based at least in part on the temperature reading.

2. The electric motor system of claim 1, wherein the thermoelectric generator is located on the power card proximate to the one or more components.

3. The electric motor system of claim 1, wherein the thermoelectric generator comprises a plurality of Peltier cells between a first junction and a second junction.

4. The electric motor system of claim 3, wherein the first junction comprises a contact with the one or more components.

5. The electric motor system of claim 3, wherein the plurality of Peltier cells are arranged in series.

6. The electric motor system of claim 3, wherein the plurality of Peltier cells are arranged in parallel.

7. The electric motor system of claim 1, wherein the controller is configured to enact the action associated with the MDE component based on the temperature reading exceeding a threshold value.

8. The electric motor driver of claim 1, wherein the controller is further configured to display the temperature reading on a user interface for an aircraft.

9. The electric motor system of claim 8, wherein the user interface is configured to receive a user input; and
wherein the controller is configured to enact the action associated with the MDE component further based on the user input.

10. The electric motor system of claim 1, wherein the MDE component further comprises a temperature sensor.

11. A method comprising:
generating power using one or more components included on a power card;
driving an electronic motor using the power generated by the one or more components included on a power card;
generating voltage data by a thermoelectric generator in response to realizing a temperature differential;
receiving, by the controller on a motor driver electronics (MDE) component, the voltage data associated with the thermoelectric generator, wherein the MDE component is configured to operate the electric motor, and wherein the MDE component comprises the power card including the one or more components;
determining, by the controller, a temperature reading based on the voltage data;
enacting an action associated with the MDE component based at least in part on the temperature reading.

12. The method of claim 11, wherein the thermoelectric generator is located on the power card proximate to at least one of the one or more components.

13. The method of claim 11, wherein the thermoelectric generator comprises a plurality of Peltier cells between a first junction and a second junction.

14. The method of claim 13, wherein the first junction comprises a contact with the one or more components.

15. The method of claim 13, wherein the plurality of Peltier cells are arranged in series.

16. The method of claim 13, wherein the plurality of Peltier cells are arranged in parallel.

17. The method of claim 11, wherein enacting the action associated with the MDE component based on the temperature reading exceeding a threshold value.

18. The method of claim 11, further comprising displaying the temperature reading on a user interface for an aircraft.

19. The method of claim 18, wherein the user interface is configured to receive a user input; and
wherein enacting the action associated with the MDE component is further based on the user input.

20. The method of claim 11, wherein the MDE component further comprises a temperature sensor.

* * * * *